(12) United States Patent
Huo et al.

(10) Patent No.: US 10,644,020 B2
(45) Date of Patent: May 5, 2020

(54) THREE-DIMENSIONAL SEMICONDUCTOR MEMORY DEVICE WITH A SUBSTRATE CONTACT REGION AND METHOD OF MANUFACTURING THE SAME

(71) Applicant: Institute of Microelectronics, Chinese Academy of Sciences, Chaoyang District, Beijing (CN)

(72) Inventors: Zongliang Huo, Beijing (CN); Tianchun Ye, Beijing (CN)

(73) Assignee: Institute of Microelectronics, Chinese Academy of Sciences, Chaoyang District, Beijing (CN)

( * ) Notice: Subject to any disclaimer, the term of this patent is extended or adjusted under 35 U.S.C. 154(b) by 0 days.

(21) Appl. No.: 15/770,020

(22) PCT Filed: Nov. 23, 2015

(86) PCT No.: PCT/CN2015/095254
§ 371 (c)(1),
(2) Date: Apr. 20, 2018

(87) PCT Pub. No.: WO2017/070995
PCT Pub. Date: May 4, 2017

(65) Prior Publication Data
US 2018/0315769 A1    Nov. 1, 2018

(30) Foreign Application Priority Data
Oct. 28, 2015    (CN) .......................... 2015 1 0713805

(51) Int. Cl.
*H01L 27/11582*    (2017.01)
*H01L 29/10*    (2006.01)
(Continued)

(52) U.S. Cl.
CPC .. *H01L 27/11582* (2013.01); *H01L 27/11573* (2013.01); *H01L 29/10* (2013.01); *H01L 29/1037* (2013.01); *H01L 27/11556* (2013.01)

(58) Field of Classification Search
CPC ......... H01L 27/11573; H01L 27/11578; H01L 27/1157; H01L 27/11582; H01L 27/11524;
(Continued)

(56) References Cited

U.S. PATENT DOCUMENTS

| | | | |
|---|---|---|---|
| 8,980,731 B2 * | 3/2015 | Kim | ........................ H01L 21/04 257/314 |
| 9,595,533 B2 * | 3/2017 | Tanzawa | ........... H01L 29/66833 |
| 2011/0058418 A1 | 3/2011 | Choi et al. | |

FOREIGN PATENT DOCUMENTS

| CN | 103165618 A | 6/2013 |
|---|---|---|
| CN | 104022120 A | 9/2014 |

(Continued)

OTHER PUBLICATIONS

International Search Report and Written Opinion for Application No. PCT/CN2015/095254, dated Jul. 12, 2016.

*Primary Examiner* — Andrew Q Tran
(74) *Attorney, Agent, or Firm* — K&L Gates LLP

(57) ABSTRACT

A three-dimensional semiconductor device includes: A peripheral circuit, distributed on a substrate; a plurality of memory cells above the peripheral circuit, each of which includes: a common source region, between the memory cell and the peripheral circuit; a channel layer, distributed in a direction perpendicular to the surface of the substrate; at least one substrate contact layer, extending horizontally from the central portion of the channel layer parallel to the surface of the substrate, each comprising at least one substrate contact region; a plurality of insulating layers, located on sidewalls of the channel layer; a plurality of control gates,
(Continued)

sandwiched between adjacent insulating layers; a gate dielectric layer, located between the channel layer and the control gates; a drain region, located at top of the channel layer; a substrate contact lead-out line, electrically connected to the substrate contact regions; and a bit line wiring, electrically connected to the drain region of each memory cell and the peripheral circuit. The substrate contact regions are formed in the middle of the memory strings, improving the erase/write performance and reliability of the memory, increasing the density of the storage array, reducing the entire memory chip area and saving the costs.

13 Claims, 10 Drawing Sheets

(51) Int. Cl.
  *H01L 27/11573* (2017.01)
  *H01L 27/11556* (2017.01)
(58) Field of Classification Search
  CPC ......... H01L 27/11521; H01L 27/11529; H01L 27/11526
  See application file for complete search history.

(56) References Cited

FOREIGN PATENT DOCUMENTS

| | | | |
|---|---|---|---|
| CN | 104037175 | A | 9/2014 |
| CN | 104241294 | A | 12/2014 |

\* cited by examiner

-prior art-

-prior art-

-prior art-

THREE-DIMENSIONAL SEMICONDUCTOR MEMORY DEVICE WITH A SUBSTRATE CONTACT REGION AND METHOD OF MANUFACTURING THE SAME

CROSS-REFERENCE TO RELATED APPLICATION

This application is a U.S. National Stage Entry under 35 U.S.C. § 371 of International Patent Application No. PCT/CN2015/095254, titled THREE-DIMENSIONAL SEMICONDUCTOR DEVICE AND MANUFACTURING METHOD THEREFOR, filed Nov. 23, 2015, which application claims priority under 35 U.S.C. 119(b) and 37 CFR 1.55 to China Application No. 201510713805.5 filed Oct. 28, 2015, the entire disclosures of which are incorporated by reference herein.

TECHNICAL FIELD

The present invention relates to a semiconductor device and manufacturing method of the same, more particularly to a three-dimensional semiconductor memory device and manufacturing method thereof.

TECHNICAL BACKGROUND

In order to improve the density of memory devices, the industry has been widely devoted to developing methods to reduce the size of memory cells arranged two-dimensionally. As the memory cell sizes in two-dimensional (2D) memory devices continue to shrink, signal conflict and interference increase significantly, making it difficult to perform multi-level cell (MLC) operations. In order to overcome the limitations of 2D memory devices, memory devices having a three-dimensional (3D) structure have been developed in the industry to increase the integration density by three-dimensionally arranging the memory cells over the substrate.

Specifically, as shown in FIG. 1A, depositing a multilayer stack structure (for example, a plurality of ONO structures with alternating oxide and nitride) on a substrate; anisotropically etching the multilayer stack structure on the substrate to form a plurality of channel vias (which may have direct access to the substrate surface or have a certain over-etch) which are distributed along the extending direction of the memory cell word line (WL) and perpendicular to the substrate surface; depositing polycrystalline silicon or other materials in the channel vias to form a plurality of columnar channels; etching the multilayer stack structure along the WL direction to form a plurality of trenches directly reaching the substrate, exposing a plurality of stacked layers surrounding the columnar channels; wet-removing a certain type of material in the stack (e.g., hot phosphoric acid to remove silicon nitride, or HF to remove silicon oxide) leaving laterally distributed protruding structures around the columnar channels; depositing a gate dielectric layer (e.g., a high-k dielectric material) and a gate conductive layer (e.g., Ti, W, Cu, Mo, and etc) on the sidewalls of the protruding structures in the trenches to form gate stack, which for example, includes a bottom selection gate line BSG, a dummy gate line DG, word lines WL0~WL31, and a top selection gate line TSG; vertically anisotropic etching to remove the gate stack outside of the protruding plane until the gate dielectric layer on the protruding side is exposed; and then etching the stacked structure to form a source/drain contact and completing the back-end manufacturing process.

In this case, a part of the protruding structures left on the sidewall of the columnar channels forms the isolation layers between the gate electrodes, while the remaining gate stack sandwiched between the plurality of isolation layers become control electrodes. When a voltage is applied to the gate, an edge electric field of the gate will make the sidewall of the columnar channels (for example poly silicon material) induced to form a source/drain region, thereby forming a gate array comprised of a plurality of MOSFETs connected in series and/or in parallel so as to record the stored logic status.

However, such a high-density three-dimensional semiconductor memory has a problem of wiring. As shown in the top view of FIG. 1B, in the conventional flash memory chip, the peripheral access circuit and the memory array area are in the same plane, occupying 20-40% of the entire Die area. For high-density memory, compressing the area of peripheral access circuitry becomes a key issue in flash memory design. In the 3D NAND memory shown in FIG. 1A, although the density can be increased by adding the number of layers of the flash memory, the reduction of the peripheral access circuit area has been relatively difficult. Especially for the TCAT structure based on hole-reasing, it is difficult to integrate the memory array area above the peripheral access circuit to reduce the area occupied by the peripheral circuit because of the substrate, as shown in the top view of FIG. 1C.

SUMMARY OF THE INVENTION

From the above, the purpose of the present invention is to overcome the above technical difficulties and propose an innovative three-dimensional semiconductor memory device and a manufacturing method thereof.

To this end, in one aspect, the present invention provides a three-dimensional semiconductor device includes: a peripheral circuit, distributed on a substrate; a plurality of memory cells above the peripheral circuit, each of which includes: a common source region, between the memory cells and the peripheral circuit; a channel layer, distributed in a direction perpendicular to the surface of the substrate; at least one substrate contact layer, extending horizontally from the central portion of the channel layer parallel to the surface of the substrate, each comprising at least one substrate contact region; a plurality of insulating layers, located on sidewalls of the channel layer; a plurality of control gates, sandwiched between adjacent insulating layers; a gate dielectric layer, located between the channel layer and the control gates; a drain region, located at top of the channel layer; a substrate contact lead-out line, electrically connected to the substrate contact regions; and a bit line wiring, electrically connected to the drain region of each memory cell and the peripheral circuit.

Wherein the channel layer is divided into a plurality of segments by the substrate contact layer; optionally, the cross-sectional shape of the channel layer parallel to the substrate surface includes at least one selected from the group consisting of rectangle, square, diamond, circle, semicircle, ellipse, triangle, pentagon, hexagon, octagon, and combinations thereof, as well as geometric shapes including selected from the group consisting of solid geometric shapes, hollow annular geometrical shapes, or a combination of a hollow annular peripheral layer and a central insulating layer evolved from the above geometric shapes; optionally, the channel layer is a monocrystal, polycrystalline, microcrystalline or amorphous layer and the material is selected from Group IV elements, Group IV compounds, Group III-V compounds, Group II-VI compounds semiconductors such as monocrystal Si, amorphous Si, polycrystalline Si, microcrystalline Si, monocrystal Ge, SiGe, Si:C, SiGe:C, SiGe:H, GeSn, InSn, InN, InP, GaN, GaP, GaSn, GaAs, or a combination thereof, and preferably further comprises a channel filling layer of a material of air, oxide, or nitride.

Wherein the gate dielectric layer further comprises a tunneling layer, a storage layer and a blocking layer; preferably, the tunneling layer comprises a single-layer structure or a multi-layer stack structure of $SiO_2$ or a high-k material; preferably, the storage layer is a single-layer structure or a multi-layer stack structure of a dielectric material having charge trapping capability, for example, any one of SiN, SiON, HfO, ZrO, and combinations thereof; preferably, the blocking layer is a single-layer structure or a multi-layer stack structure of silicon oxide, aluminum oxide, hafnium oxide, or the like.

Wherein the material of the control gate is selected from any one of doped polysilicon, doped monocrystal silicon, metal, metal alloy, conductive metal oxide, conductive metal nitride, conductive metal silicide or a combination thereof; and optionally, further comprise a floating gate horizontally adjacent to the control gate via the insulating layer and/or the gate dielectric layer between adjacent insulating layers.

Wherein the common source region comprises any one or a combination of doped polysilicon, doped monocrystal silicon, metal silicide and metal nitride; preferably, the common source region has a different conductivity type from the channel layer and/or the substrate contact regions.

The present invention also provides a method for manufacturing a three-dimensional semiconductor device, comprising the steps of:

(a) forming a peripheral circuit on a substrate;
(b) forming a common source region on the peripheral circuit;
(c) forming an insulating layer stack, which comprises a plurality of first material layers and a plurality of second material layers alternately stacked;
(d) etching the insulation layer stack to form a plurality of vertical openings, forming a gate dielectric layer on sidewalls of the openings, and forming a plurality of channel layers on sidewalls of the openings and top of the insulation layer stack;
(e) recycling steps c and d until at least one substrate contact layer is formed with the plurality of channel layers on top of the adjacent insulating layer stacks;
(f) forming a plurality of drain regions on top of the channel layers;
(g) selectively etching to remove the second material layers, and then forming a plurality of control gates in recesses between every two of the remaining first material layers;
(h) etching the first material layers and the control gates to form openings exposing the substrate contact layers, forming a substrate contact region at bottom of each of the openings, forming a substrate contact lead-out line in each of the openings;
(i) forming a bit line wiring, electrically connecting the drain regions and the peripheral circuit.

The present invention further provides a method for fabricating a three-dimensional semiconductor device, comprising the steps of:

(a) forming a peripheral circuit on a substrate;
(b) forming a common source region on the peripheral circuit;
(c2) forming a plurality of insulating layer stacks on the common source region, each of which comprises a plurality of first material layers and a plurality of second material layers alternately stacked; and forming at least one substrate contact layer between adjacent insulation layer stacks;
(d2) etching the plurality of insulating layer stacks and at least one substrate contact layer to form a plurality of vertical openings;
(e2) forming a plurality of channel layers on sidewalls of the openings and top of the insulating layer stacks;
(f) forming a plurality of drain regions on top of the channel layers;
(g2) selectively etching to remove the second material layers, and then forming a gate dielectric layer and a plurality of control gates in recesses between every two of the remaining first material layers;
(h) etching the first material layers and the control gates to form openings exposing the substrate contact layers, forming a substrate contact region at bottom of each of the openings, forming a substrate contact lead-out line in each of the openings;
(i) forming a bit line wiring, electrically connecting the drain regions and the peripheral circuit.

Wherein step (b) further comprises: etching the ILD on the peripheral circuit to form recesses; filling with doped semiconductor or conductor to form a common source region; and planarizing the common source region until the ILD is exposed; or depositing with doped semiconductor or conductor on the peripheral circuit and etching to form a common source region; forming an ILD covering the common source region: and planarizing the ILD until the common source region is exposed.

Wherein step (g) or (g2) further comprises: selectively etching to remove the second material layer to leave lateral recesses between the remaining first material layers, forming a floating gate in each of the lateral recesses; forming an insulating layer and/or a gate dielectric layer on the floating gates: and forming a control gate on the insulating layer and/or the gate dielectric layer in each of the lateral recesses.

Wherein an ion implantation is performed to form the substrate contact regions in step (h); preferably, the substrate contact regions have different conductivity type from the common source region.

According to the three-dimensional semiconductor memory device and the method for fabricating the same of the present invention, a substrate contact is formed in the middle of a memory string to improve the performance and reliability of memory erase and write, increase the storage density, reduce the area of the entire memory chip, reduce costs.

BRIEF DESCRIPTION OF THE DRAWINGS

The technical solutions of the present invention are described in detail below with reference to the accompanying drawings, in which.

DETAILED DESCRIPTION

Figure 1A:
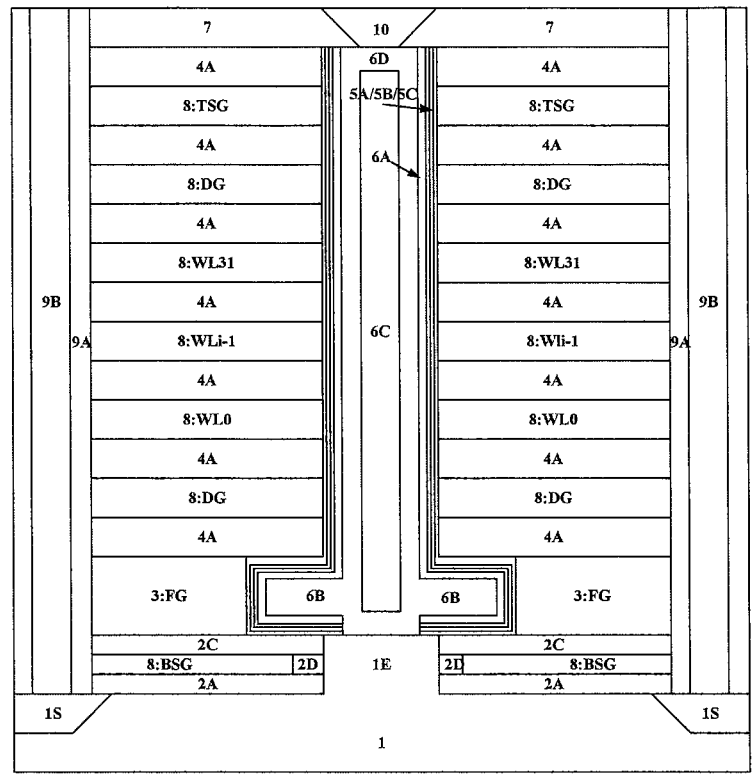
FIG. 1A is a cross-sectional view of a prior art three-dimensional semiconductor memory device.
Figure 1B:
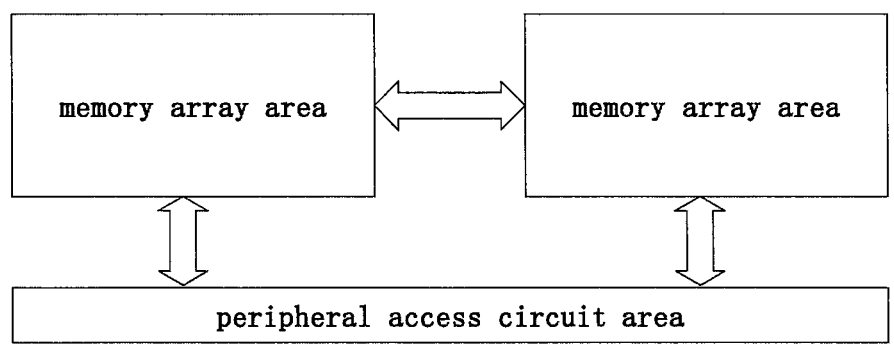
FIG. 1B is a top view of a prior art flash memory chip layout.
Figure 1C:
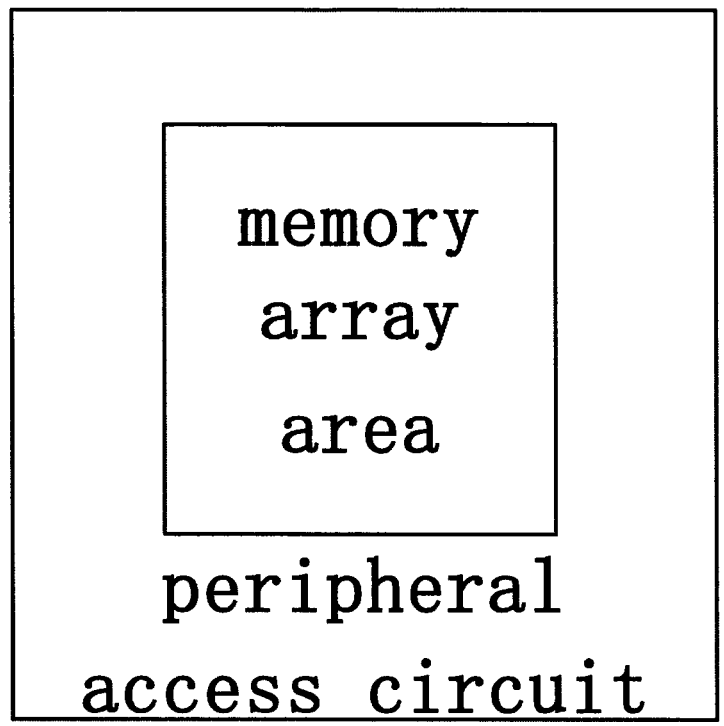
FIG. 1C is top view of the chip layout to be achieved.

The features and technical effects of the technical solution of the present invention will be described in detail below with reference to the accompanying drawings, in conjunction with the schematic embodiments. A three-dimensional semiconductor memory device and a method for fabricating the same are disclosed in order to effectively improve the storage density. It should be noted that similar reference numerals denote similar structures, and the terms "first," "second," "upper," "lower," and the like as used in this application may be used to modify various device structures or manufacturing processes. These modalities do not imply the spatial, order or hierarchical relationship of the device structure or fabrication process to be modified unless otherwise specified.

FIGS. 2A to 2L show cross-sectional views of various steps of a method for fabricating a three-dimensional semiconductor memory device according to one embodiment of the present invention.

Figure 2A:
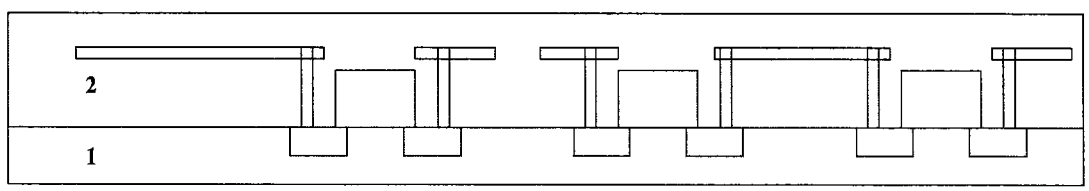
FIGS. 2A-2L are cross-sectional views of various steps of a method of fabricating a three-dimensional semiconductor memory device in accordance with one embodiment of the present invention.

As shown in FIG. 2A, a peripheral access circuit is formed on a chip substrate 1. The substrate 1 is provided, and the material of the substrate 1 may include bulk Si, bulk Ge, SOI, GeOI, or other compound semiconductor substrates such as SiGe, SiC, GaN, GaAs, InP, etc., as well as combinations thereof. The substrate 1 is preferably a silicon-containing substrate such as Si, SOI, SiGe, Si:C or the like for compatibility with existing IC fabrication processes. Peripheral access circuitry is formed in and/or on the substrate 1 by a CMOS-compatible planar process. FIG. 2A shows a source/drain region, a gate stack (including a gate dielectric layer and a gate conductive layer), a contact wire (all not separately marked). An interlayer dielectric layer (TLD) or inter-poly dielectric layer (IPD) 2 of silicon oxide or low-k material is then formed by processes such as CVD, spin coating, spray coating, screen printing, pyrolysis, oxidation, wherein the low-k material includes but not limited to organic low-k materials (such as aryl or polycyclic organic polymers), inorganic low-k materials (such as amorphous carbonitride films, polycrystalline boron nitride films, fluorosilicate glasses, BSG, PSG, BPSG), porous low-k materials (such as disilicosiloxane (SSQ)-based porous low-k materials, porous silica, porous SiOCH, C-doped silica, F doped porous amorphous carbon, porous diamonds, porous organic polymers). Preferably, ILD2 is CMP planarized. The thickness of ILD2 is greater than the height of the topmost wiring of the peripheral access circuitry, for example, 100 nm to 10 gm greater than the topmost wiring height to leave space for the source of subsequent devices.

Figure 2B:
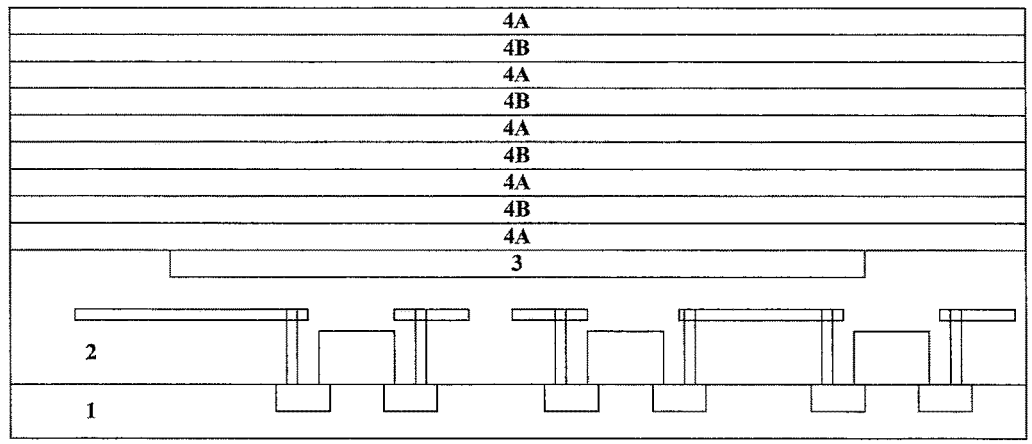

As shown in FIG. 2B, the source region 3 of the memory array device cell and the stack 4A/4B of the multi-layered films are formed on top of the ILD 2 of the peripheral access circuit.

In a preferred embodiment of the present invention, a groove may be formed on the top of the ILD 2 through a photolithography/etching process and then filled with a doped semiconductor or conductor material by CVD, or PVD film-forming process to form the common source region 3 of the memory device; or a film of doped semiconductor or conductor material is formed on the top of the ILD2 by a film-forming process, and then is etched to form a pattern of a common source region 3, and subsequently silicon oxide or a low-k material (combined with ILD2) is formed to surround the common source region 3. The material of the common source region 3 for example doped polysilicon or doped monocrystal silicon, has a first doping type such as N+ (or P+), and may further comprise a metal silicide ($CoSi_x$, $NiSi_x$, $PtSi_x$, etc.) on its top to reduce the contact resistance, or comprise metal nitrides (WN, TiN, TaN, etc.) to block the diffusion of metal ions such as Al, Cu and the like, from affecting the device performance in order to improve the adhesion. Preferably, the common source region 3 is CMP planarized until ILD2 is exposed, or ILD2 (including the ILD material formed after formation of the co-source region 3) is CMP planarized until the common source region 3 is exposed, anyway ILD2 is made flush with the top of the common source region 3.

Subsequently, a stack structure 4 of multi-layered insulating dielectric films is formed on top of the ILD2/common source region 3, comprising a plurality of first material layers 4A and a plurality of second material layers 4B alternately stacked. The material of the stack structure 4 is selected from a combination of the following materials and includes at least one insulating medium: such as silicon oxide, silicon nitride, silicon oxynitride, amorphous carbon, diamond-like carbon (DLC), germania, alumina, etc. and combinations thereof. The first material layers 4A have a first etch selectivity and the second material layers 4B have a second etch selectivity which is different from the first etch selectivity. In a preferred embodiment of the present invention, the combination of the stack structures 4A/4B is, for example, a combination of silicon oxide and silicon nitride, a combination of silicon oxide or silicon nitride and amorphous carbon, and the like. In a preferred embodiment of the present invention, the etch selectivity ratio of layers 4A to 4B is relatively great (e.g., greater than 5:1) under wet etch conditions or oxygen plasma dry etch conditions.

Figure 2C:
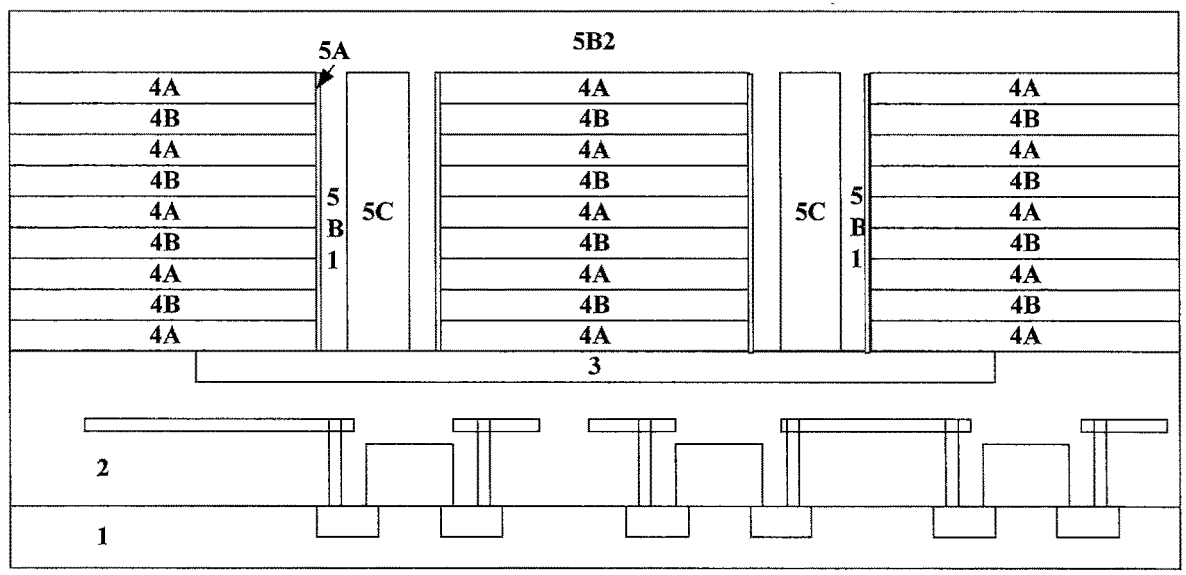

As shown in FIG. 2C, a plurality of gate dielectric layers and a plurality of channel layers are formed in the stack structure.

An anisotropic etching process, such as plasma dry etching or RIE using a fluorocarbon ($C_xH_yF_z$ constituting fluorohydrocarbon) as an etching gas, is selected to vertically down etch the insulating stack 4A/4B until the common source region 3 is exposed in order to form a plurality of deep holes or trenches (not shown). The cross-sectional shapes of the trenches cut parallel to the surface of the substrate 1 may be rectangular, square, diamond, circle, semicircle, oval, triangle, pentagon, hexagon, octagon, etc.

The gate dielectric layers 5A and the channel layers 5B1 are sequentially deposited in the deep holes by the processes of PECVD, HDPCVD, UHVCVD, MOCVD, MBE or ALD. The gate dielectric layers 5A may include a single layer or a plurality of sub-layers such as a tunneling layer, a storage layer, and a barrier layer at least, wherein the barrier layer directly contacts the insulating layer stack 4A/4B on the sidewalls of the deep holes, and the tunneling layer locates closest to the deep hole center axis and contacts the channel layer deposited subsequently. The tunneling layer comprises $SiO_2$ or a high-k material, wherein the high-k material includes but not limited to nitrides (such as SiN, AlN, TiN), metal oxides (mainly subgroups and lanthanide metal element oxides such as MgO, $Al_2O_3$, $Ta_2O_5$, $TiO_2$, ZnO, $ZrO_2$, $HfO_2$, $CeO_2$, $Y_2O_3$ and $La_2O_3$), oxynitrides (such as SiON and HfSiON), perovskite phase oxide (For example, $PbZr_xTi_{1-x}O_3$ (PZT), $Ba_xSr_{1-x}TiO_3$ (BST)), etc. The tunneling layer may be a single-layer structure or a multi-layer stack structure of the above materials. The storage layer is a dielectric material having charge trapping capability, such as SiN, SiON, HfO, ZrO, etc, and a combination thereof, and may also be a single-layer structure or a multi-layer stack structure of the above materials. The blocking layer may be a single-layer structure or a multi-layer stack structure of a dielectric material such as silicon oxide, aluminum oxide, hafnium oxide, or the like. In an embodiment of the present invention, the gate dielectric layer 5A is, for example, an ONO structure made of silicon oxide, silicon nitride, and silicon oxide.

The channel layer 5B1 is formed on the bottom of each deep hole and at least one substrate contact layer 5B2 is formed on sidewalls of each deep hole, and both may be monocrystal, polycrystal, or amorphous material. The material of the channel layer 5B1 may be selected from Group IV elements or compounds, Group III-V or Group II-VI compound semiconductors such as Si, Ge, SiGe, SiC, GeSn, InSn, InN, InP, GaN, GaP, GaSn, GaAs, and the like, and combinations thereof. The process may be selected from MOCVD, MBE, ALD, or CVD (LPCVD, PECVD, HDP-CVD, UHVCVD). In one embodiment of the present invention, the channel layer 5B1 is deposited in such a way as to partially fill the sidewalls of the trenches to form a hollow cylinder with an air gap 5C. In other embodiments not shown in the drawings, the channel layer 5B1 is selected to be deposited in such a way as to completely or partially fill the trenches, forming a solid column, a hollow ring, or a core-shell structure having a hollow ring filled with an insulating layer (not shown). The horizontal cross-section of the channel layer 5B1 is similar in shape and preferably conformal with the trenches, and may be a solid geometry such as rectangle, square, diamond, circle, semicircle, oval, triangle, pentagon, hexagon, octagon, etc., or a hollow ring-shaped, barrel-like structure (and the interior of which may be filled with an insulating layer) evolving from the above geometries. Preferably, for the hollow column channel layer 5B1 structure, a insulating layer 5C may further formed by filling with silicon oxide material inside the channel layer 5B1 using process such as LPCVD, PECVD or HDPCVD for supporting, insulating and isolating from the channel layer 5B1. As shown in FIG. 2C, the deposition thickness of the channel layer 5B1 is controlled so that the channel layer 5B1 of the semiconductor material is distributed not only in the trenches but also on the top of the dielectric stack 4A/4B for use as a bottom lead-out structure 5B2 for future memory strings. Preferably, the channel layer 5B1 has a second doping type such as P+ or intrinsic non-doping by ion implantation or in-situ doping.

Figure 2D:
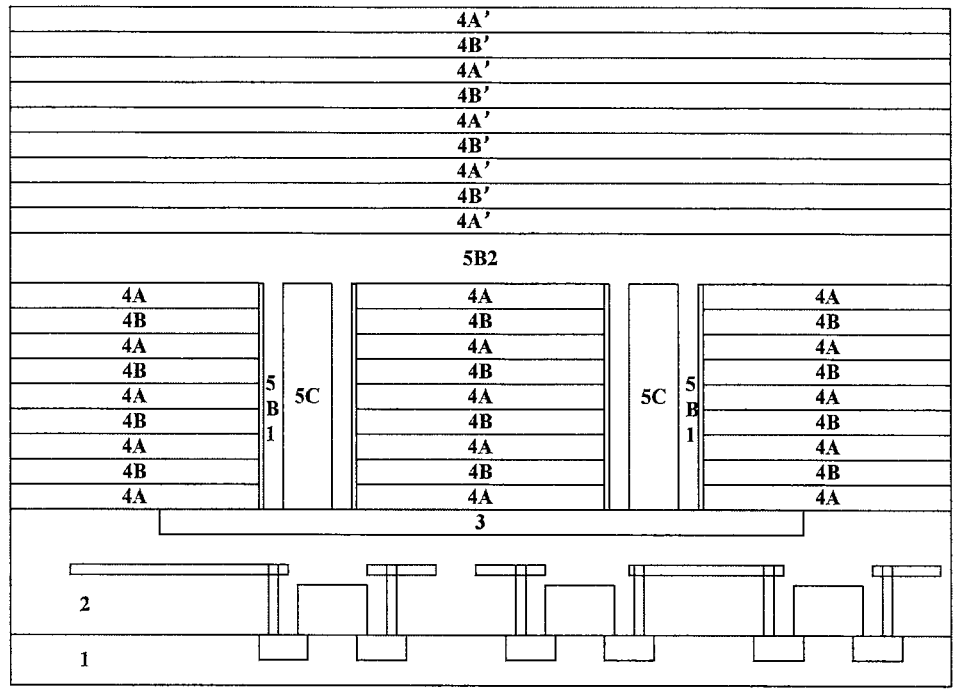

As shown in FIG. 2D, a second dielectric stack 4A'/4B' is formed on the bottom memory string with the same or similar process steps and materials as shown in FIG. 2B.

Figure 2E:
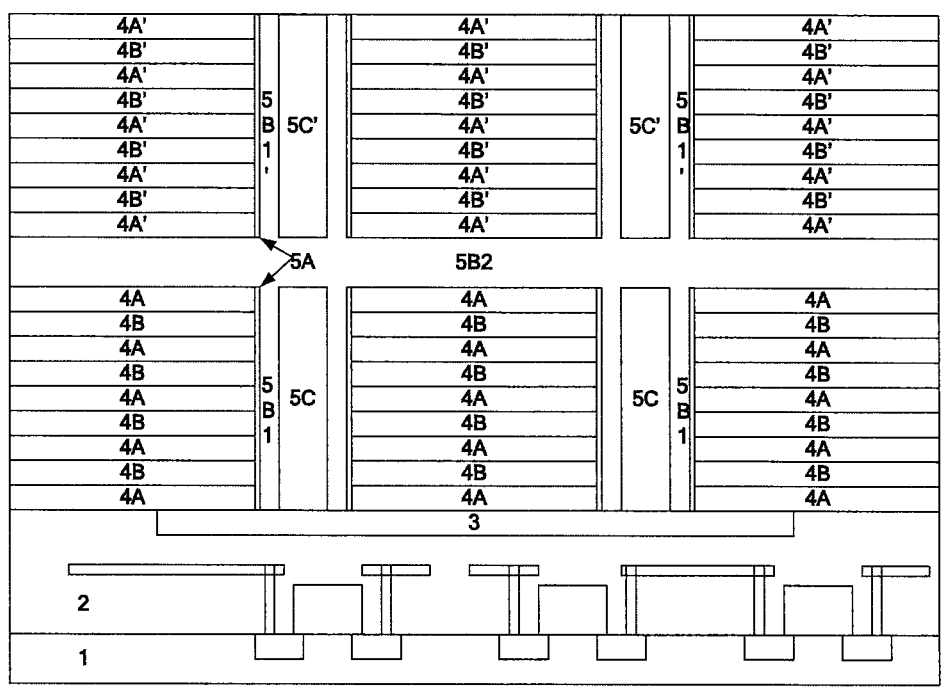

As shown in FIG. 2E, a second gate dielectric layer 5A' and a second channel layer 5B1' are formed in the second dielectric stack 4A'/4B' with the same or similar process steps and materials as those shown in FIG. 2B. As shown in FIG. 2E, the channel layer semiconductor material between adjacent memory strings will be fusion bonded to form a substrate contact layer so as to form substrate contact lead-out line in the middle of the memory strings. Thus in a very high stack, the distance for substrate holes to reach the lower/upper regions will be reduced, achieve in fast hole transport and improving memory erase/write performance and reliability; at the same time, instead of the traditional idea that both of substrate and source region are in the lower portion of 3D NAND, this design of separated substrate contact and source region according to the present invention can change the lower selective transistors from L-type to vertical transistors, further reducing width of selective gate electrodes and increasing the density of the storage array. Additionally the design that the substrate contact is in the middle portion can really make the storage array directly located above the peripheral access circuit, reducing the entire memory chip area and saving the costs. Further, the steps of FIGS. 2B-2E may be cycled to form an alternating stack of multiple dielectric stacks and multiple substrate contact layers (the horizontal portion of layer 5B2) so that the substrate contacts are uniformly distributed, further enhancing the reliability of the device.

Figure 2F:
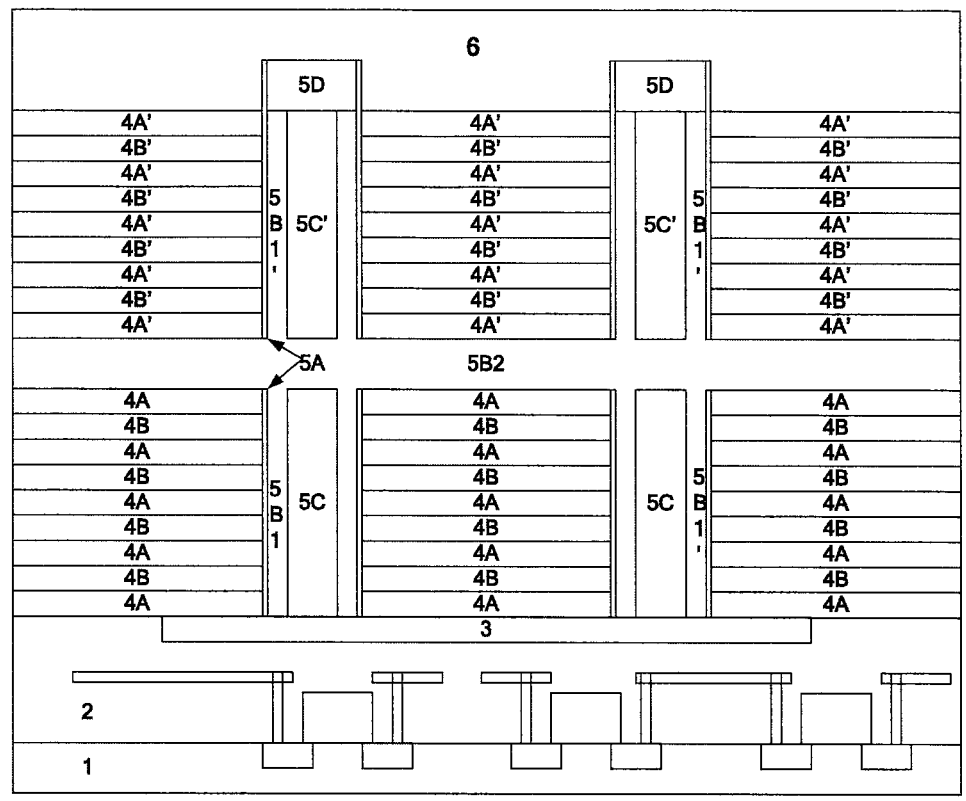

As shown in FIG. 2F, a plurality of drain regions (or refer to as bit line contact regions) and an insulating layer are formed on top of the channel layer. Preferably, the carrier mobility can be increased by using the same or similar material with the material of the channel layers 5B1/5B1' (e.g., materials similar to Si, such as amorphous Si, poly-Si, SiGe, SiC, etc., so as to fine tune the lattice constant in order to increase the carrier mobility and control the driving performance of the unit device) to deposit on top of the channel layer to form the drain regions 5D of the memory cell unit transistor. Naturally, if the channel layer 5B1 is a completely filled solid structure, then the portion of the channel layer 5B1 at the top of the entire device constitutes a plurality of corresponding drain regions 5D without additional drain region deposition steps. In other embodiments of the present invention, the drain regions 5D may also be a metal, a metal nitride, a metal silicide, constituting a metal-semiconductor contact to form a Schottky device on the top. Next, an insulating layer 6 (eg, an interlayer dielectric layer ILD, or a hard mask HM) is formed over the entire device. Preferably, the insulating layer 6 is CMP planarized.

Figure 2G:
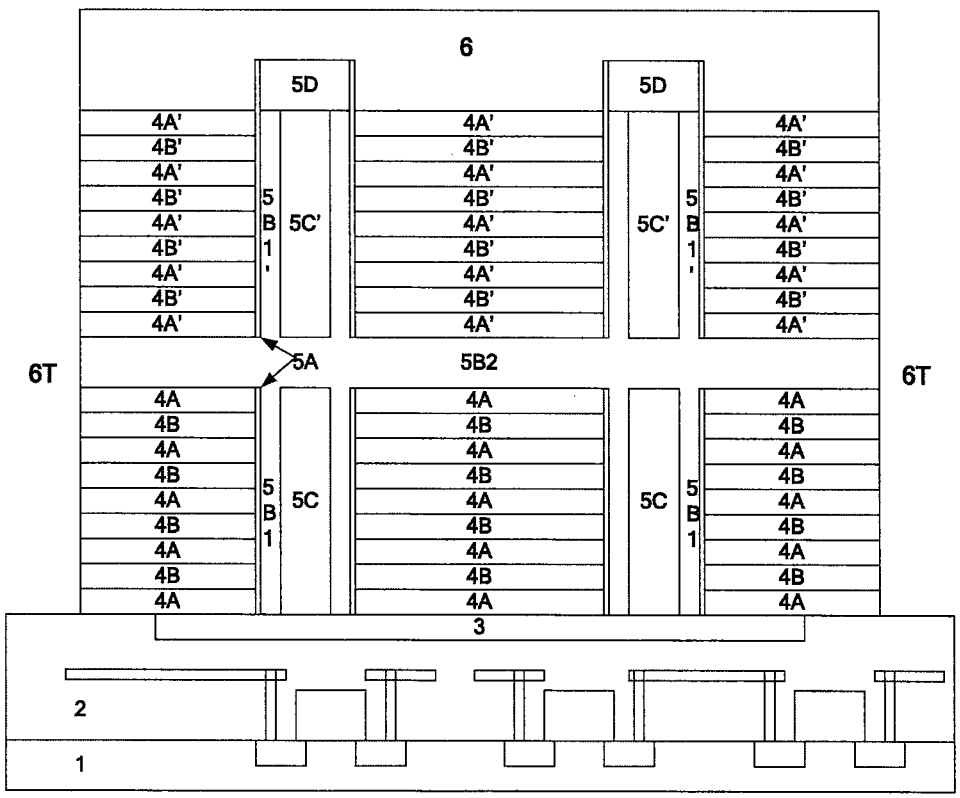

As shown in FIG. 2G the insulating layer 6 and the dielectric stack 4/4' are etched until the top of the ILD 2 of the bottom peripheral access circuit is exposed; thereby the sidewalls of the dielectric stack are also exposed. An anisotropic etching process is performed using a photoresist mask pattern (not shown), to vertically and successively etch the insulating layer 6, the second dielectric stack 4A'/4B', the channel layer 5B1, and the first dielectric stack 4A/4B until the top of the ILD2 of the peripheral access circuit is exposed, forming a plurality of vertical openings 6T. In a plan view (not shown), a plurality of vertical openings 6T will surround each of the vertical channels 5B1/5C, for example each vertical channel is averagely surrounded by 2 to 6 vertical openings 6T. The cross-sectional shape of the opening 6T may be the same as that of the deep hole or the channel layer. The sides of the openings 6T expose sidewalls of the dielectric stack including the first material layers 4A/4A' and the second material layers 4B/4B' to facilitate later etching to remove the second material layers.

Figure 2H:
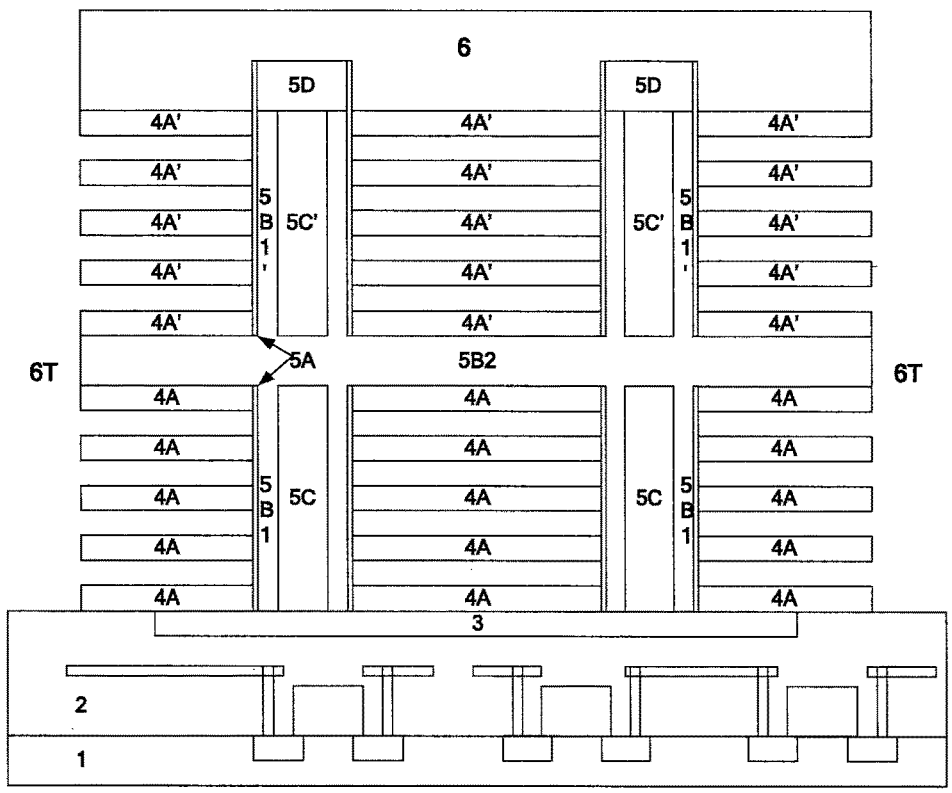

As shown in FIG. 2H, the second material layers 4B and 4B' are selectively removed. The isotropic etching process is used to remove all the second material layers 4B/4B' in the dielectric layer stack 4/4', leaving only the plurality of first material layers 4A/4A'. Depending on the material of layers 4A/4B, a wet etching solution may be selected to isotropically etch to remove the layers 4B. Specifically, HF-based etching solution is adopted for the silicon oxide material, hot phosphoric acid etching solution is used for the silicon nitride material, and strong alkali etching solution such as KOH or TMAH is used for the polycrystalline silicon or the amorphous silicon materials. Also, oxygen plasma dry etching is used for amorphous carbon, DLC and other carbon-based materials, making O and C react to form gases to be drawn out. After removal of the second material layers 4B and 4E3', a plurality of lateral recesses (in the horizontal direction parallel to the substrate surface) are left between the plurality of first material layers 4A and 4A' for later formation control gates (or refer to as word line WL).

Figure 2I:
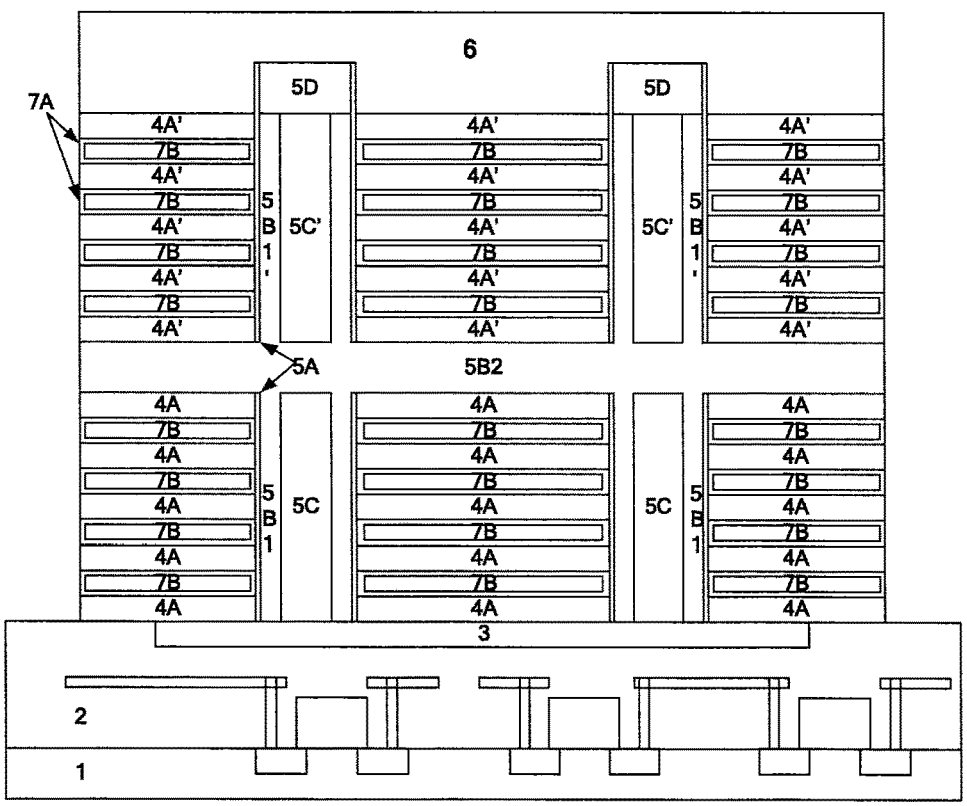

As shown in FIG. 2I, a plurality of control gate stacks 7 are formed in the plurality of recesses, including an optional (may or may not be present) gate dielectric layer 7A and a gate conductive layer 7B. Preferably, the layer 7A of a high-k material or a nitride is formed by a conventional method such as PVD, CVD, ALD or the like, and may be a single layer structure or a multi-layer stack structure, wherein the nitride material is for example $M_xN_y$, $M_xSi_yN_z$, $M_xAl_yN_z$, $M_aAl_xSi_yN_z$, where M is Ta, Ti, Hf, Zr, Mo, W or other elements. The gate conductive layer 7B is formed by processes such as MOCVD, MBE, ALD and the like, and may be polysilicon, poly-SiGe, or metal, where the metal may include metal element such as Co, Ni, Cu, Al, Pd, Pt, Ru, Re, Mo, Ta, Ti, Hf, Zr, W, Ir, Eu, Nd, Er, La, or an alloy of these metals, or a nitride of these metals. The gate conductive layer 7B may be doped with C, F, N, O, B, P, As or other elements to adjust its work function.

Optionally, before the control gate stacks 7 are formed, a floating gate (not shown) of material such as poly silicon, amorphous silicon or the like may be formed in the recesses. The control gate stacks are formed after the insulating layer is deposited, so that the floating gate and the control gate stacks are horizontally adjacent in order to improve the gate control ability.

Figure 2J:
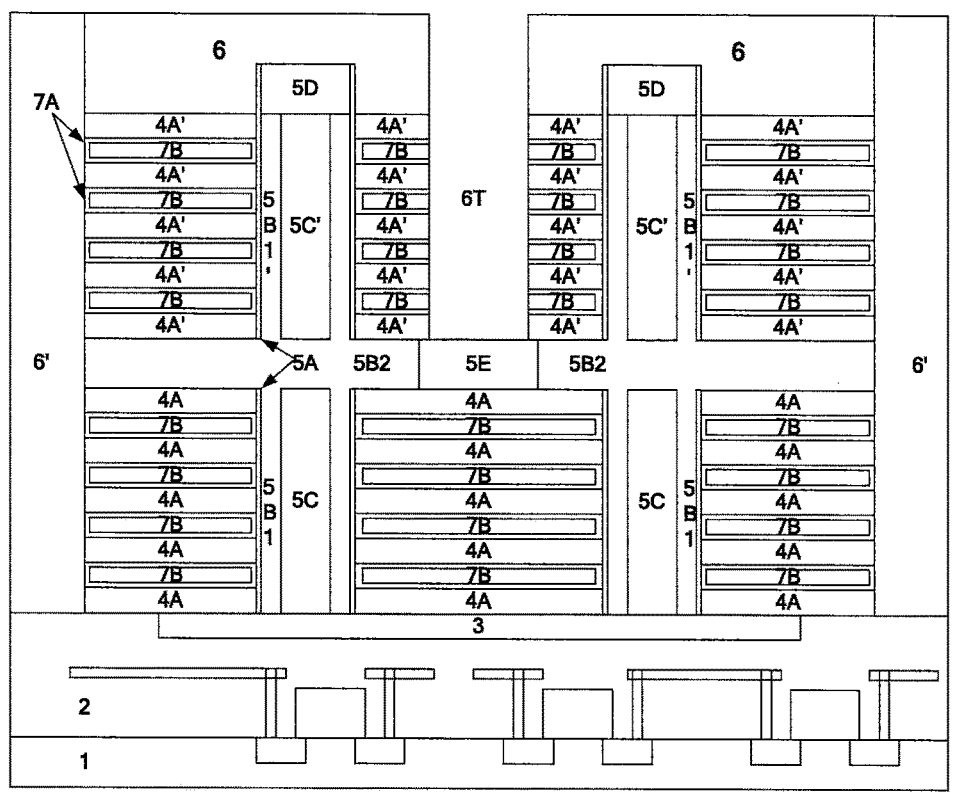

As shown in FIG. 2J, a plurality of substrate contact regions are formed. Preferably, an additional insulating layer 6' is further formed to fill the openings 6T. The insulating layer 6, the first material layers 4A' and the gate stacks 7A/7B in the upper section are anisotropically etched using a photolithography/etching process to form a plurality of openings 6T' until substrate contact layer 5B2 in the middle section is exposed. A substrate contact region 5E is formed in the substrate contact layer 5B by ion implantation with a second doping type such as a P+ doping region formed by implanting B, BF2, Ga, Al, or In. The openings 6T' may be deep holes formed by etching, or may be strip trenches to be connected by a lead-out line. In a top plan view (not shown), the openings 6T' are distributed around the vertical channels 5B1, the number of which may be plural, for example, two, four, six, or the like.

Figure 2K:
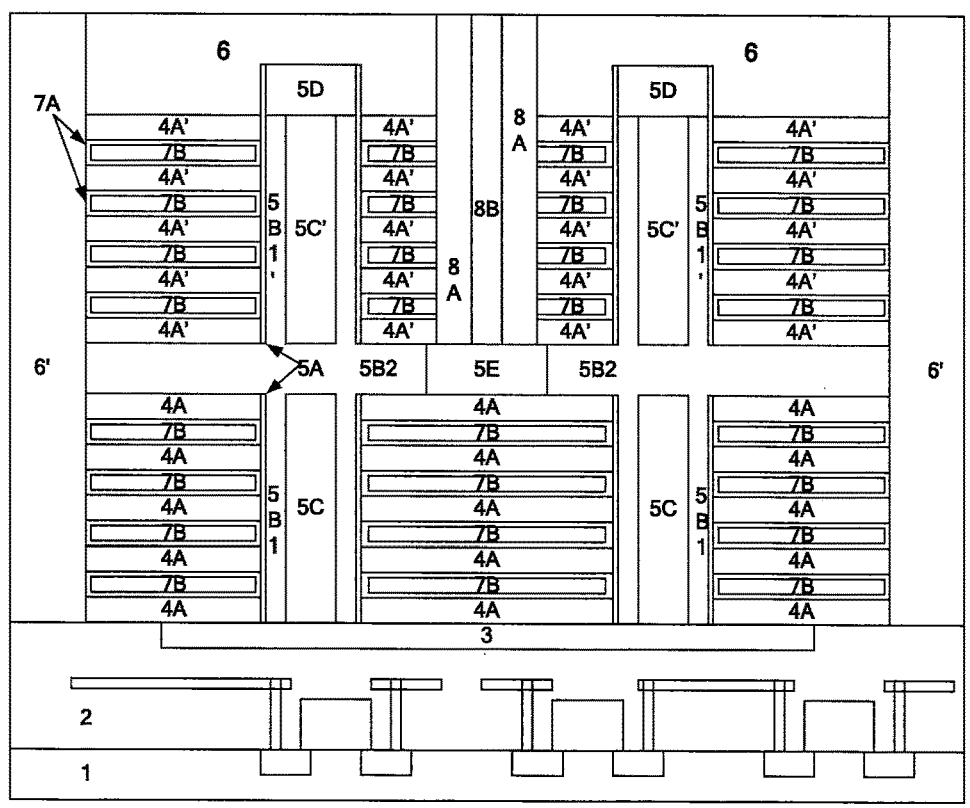

As shown in FIG. 2K, a metal is filled in the openings 6T' to form a plurality of substrate contact lines. For example, an insulating medium is firstly deposited and then etched to remove the horizontal bottom, leaving a sidewall 8A of such as silicon oxide, silicon nitride or silicon oxynitride on the sidewall of the openings 6T' for isolating and insulating the gate conductive layers 7B. A plurality of substrate contact lines 8B are then formed in the remaining space of the openings 6T' by MOCVD, ALD, evaporation, sputtering or the like, and the material of which is a metal, a metal alloy, a conductive metal oxide/nitride/silicide, the metal is any one selected from Co, Ni, Cu, Al, Pd, Pt, Ru, Re, Mo, Ta, Ti, Hf, Zr, W, Ir, Eu, Nd, Er, La or the like or a combination thereof.

Figure 2L:
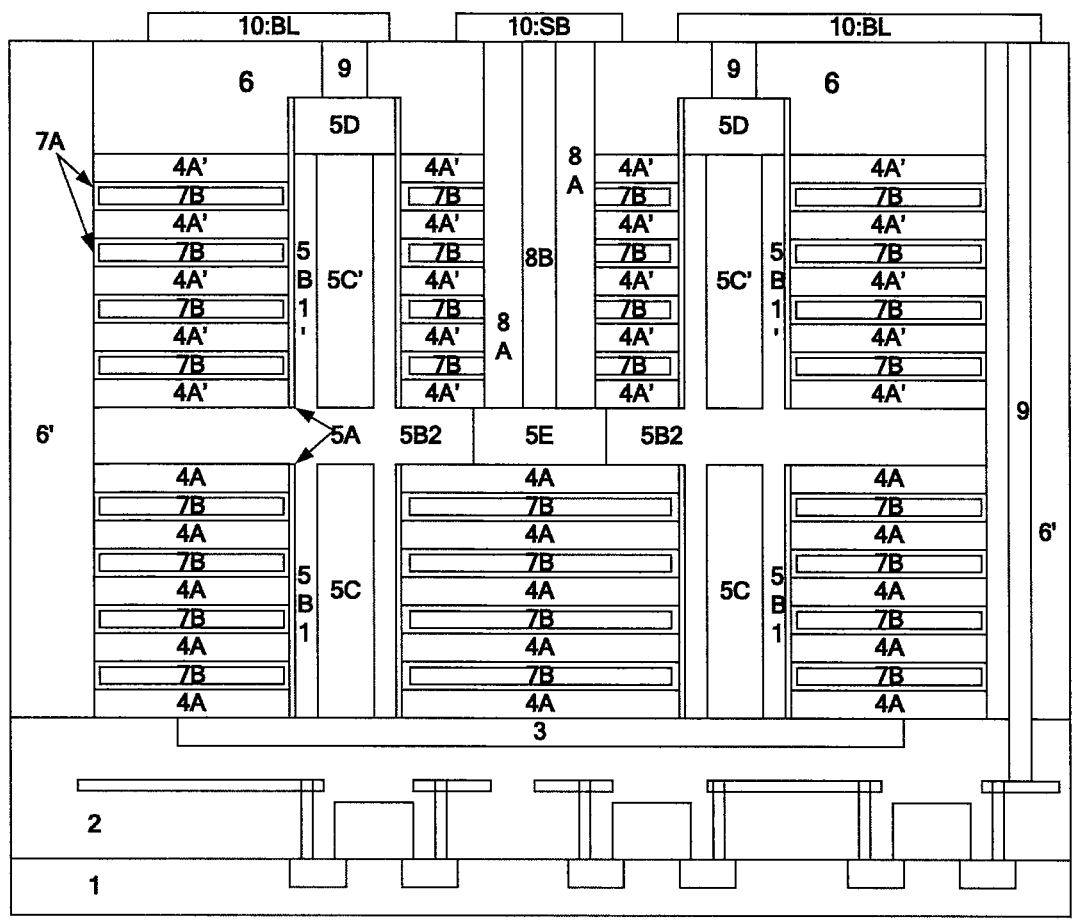

Finally, as shown in FIG. 2L, the wiring of the memory array and the peripheral circuit are completed. The insulating layer 6 is etched to form a plurality of holes exposing drain regions 5D of the memory array device unit and the insulating layer 6' is etched to form a plurality of deep holes exposing the top wiring of the peripheral access circuit. The filler metal is deposited to form a plurality of connecting lines 9 for connecting the drain regions or the peripheral wirings. The wiring 10 (bit line wiring 10: BL, or substrate contact wiring 10: SB) are then formed on top of the entire device to electrically connect the peripheral access circuit with the memory array device unit.

The resulting device 2L has a cross-sectional view shown as FIG. 2L. A three-dimensional semiconductor device includes a plurality of memory cells on top of a peripheral circuit, each of the plurality of memory cells including: a common source region 3 between a memory cell and a peripheral circuit; a plurality of channel layers 5B1/5B1' distributed in a direction perpendicular to the surface of the substrate 1; a plurality of substrate contact layers 5B2 (middle horizontal portion) extending horizontally from the middle of the channel layers 5B1 in parallel to the substrate surface and including at least one substrate contact region 5E; a plurality of insulating layers 4A on sidewalls of the channel layers 5B1; a plurality of control gates 7B sandwiched between the adjacent insulating layers; a gate dielectric layers 5A/5A' between the channel layers 5B and the control gates 7B; a plurality of drain regions 5D on top of the channel layers 5B1/5B1'; a plurality of substrate contact lead-out lines 8B electrically connecting to the substrate contact regions 5E; and bit line wirings (9,10) electrically connecting to the drain regions 5D and top wiring of the peripheral circuits of the memory cell. Since the lower and upper sections are separately deposited, the gate dielectric layer is divided into two sections 5A and 5A', the channel layers are also divided into lower and upper sections 5B1 and 5B1', and the channel filling layer are also further divided into two sections 5C and 5C', each of which is separated by the substrate contact layers 5B2.

FIGS. 3A-3F are cross-sectional views of various steps of a method for fabricating a three-dimensional semiconductor memory device according to another embodiment of the present invention.

Figure 3A:
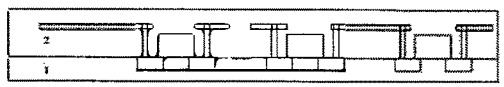
FIGS. 3A-3F are cross-sectional views of various steps of a method for fabricating a three-dimensional semiconductor memory device according to another embodiment of the present invention.

As shown in FIG. 3A, a peripheral circuit is formed on the substrate 1 and then an ILD 2 is formed, similar to or same as FIG. 2A.

Figure 3B:
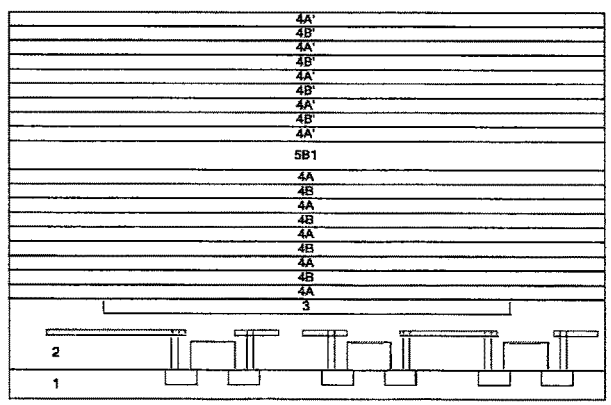

As shown in FIG. 3B, the processes are similar to those of FIG. 2B. A common source region 3 is formed in the ILD 2, a plurality of dielectric stacks 4A/4B are formed on the common source region 3, a substrate contact layer 5B1 is formed on the dielectric stacks 4A/4B, and a plurality of dielectric stacks 4A'/4B' are further formed on the substrate contact layer 5B1.

Figure 3C:
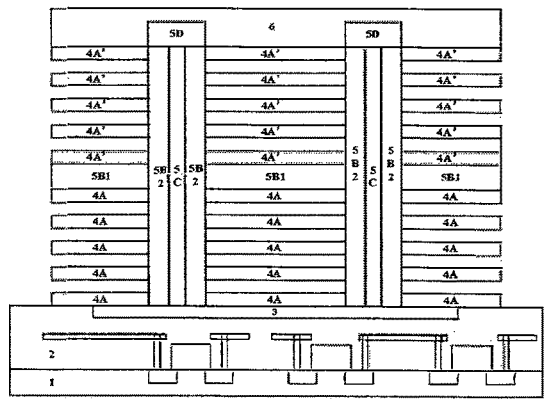

As shown in FIG. 3C, similar to the processes of FIGS. 2E~2H, a plurality of dielectric stacks and layer 5B1 are etched to form openings until the common source region 3 is exposed, a plurality of vertical channel layers 5B2 and a plurality of channel filling layers 5C are respectively formed in the openings (preferably, the vertical channel layers 5B2 are same with the substrate contact layer 5B1 on both of material and doping type so as to subsequently enable a substrate lead-out of the transistor cell), and then a plurality of drain regions 5D are deposited. An insulating layer 6 of the ILD is formed to cover the entire device, performing photolithography/etching process to form a plurality of vertical openings until top of the ILD 2 of the bottom peripheral circuit is exposed. The second material layers 4B/4B' are selectively etched away from sidewalls of the vertical openings, leaving recesses between the first material layers 4A/4A'.

Figures 3D, 3E, 3F:
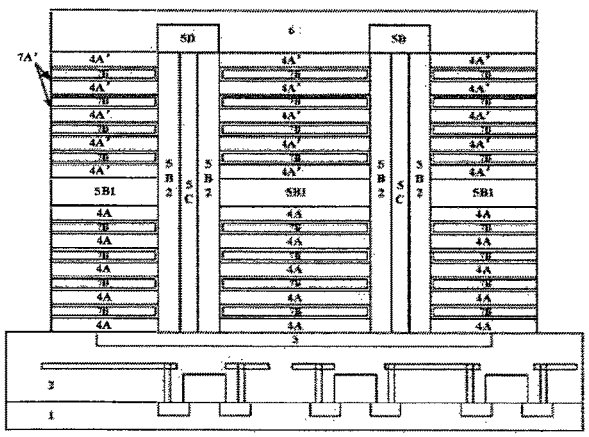

As shown in FIG. 3D, a gate dielectric layer 7A' and a gate conductive layer 7B are successively filled in each lateral recess. The gate dielectric layer 7A' is similar to the gate dielectric layer 5A in FIG. 2C, also including a plurality of sub-layer stack structures of a tunneling layer, a storage layer and a blocking layer, and the materials of each of the layers are similar or same. In addition, the gate dielectric layer 7A' may include a floating gate (not shown, having same material as described of FIG. 2I) formed close to the inner side of the channel layer 5B2, insulated and isolated from the gate conductive layer 7B by the gate dielectric layer 7A'.

As shown in FIG. 3E, similar to the processes of FIGS. 2J and 2K, the insulating layer 6, the first material layers 4A/4A', and the gate conductive layers 7B are etched until the substrate contact layer 5B1 (the lateral portion) is exposed. The substrate contact regions 5E are formed by ion implantation and a plurality of substrate contact lines 8B are formed.

Finally, as shown in FIG. 3F, similar to the processes of FIG. 2L, bit line wirings (9, 10) are formed to electrically connect the drain regions 5D and top wiring of the peripheral circuit of the memory cell. The device structure is similar to that of FIG. 2L, except that since the horizontal portion of the substrate contact layer 5B1 and the upper/lower dielectric stack 4A/4B are firstly deposited and then etched and then filled in the channel, thus the channel stack structure of channel layers 5B2 and channel filling layers 5C will be in contact together to connect with the common source region 3. Namely all of the respective structural portions of the channel stacks are connected together and the substrate contact layer 5B1 horizontally encloses the middle portion of the channel stacks 5B2.

Each of the remaining process steps and materials in FIGS. 3A~3F may be equivalent to those shown in FIGS. 2A~2L, details thereof are not described here anymore.

In this invention, the substrate is formed in the middle of the memory strings, so that in a very high stack, the distance for substrate holes to reach the lower/upper regions will be reduced, achieving in fast holes transport and improving memory erase/write performance and reliability. At the same time, instead of the traditional idea that both of substrate and source region are in the lower portion of 3D NAND, this design of the present invention can change the lower selective transistors from L-type to vertical transistors, further reducing width of selective gate electrodes and increasing the density of the storage array. Additionally the design that the substrate is in the middle portion can really make the storage array directly located above the peripheral access circuit, reducing the entire memory chip area and saving the costs.

It should be noted that although the drawings in the embodiments of the present invention only show that one substrate contact layer divides the channel layer into upper and lower portions, a plurality of substrate contact layers may be used to divide the channel layer into 3 segments, 4, 5 or more segments. In addition, although the drawings show that the memory cell array locates directly above and at least partially or completely overlapping with the peripheral circuit, it is also possible to make it surround the peripheral circuit as long as the horizontal portion of the substrate contact layer 5B, the common source region 3, and the drain region 5D are located in different planes.

According to the three-dimensional semiconductor memory device and the method of fabricating the same in the present invention, a substrate contact is formed in middle of the memory strings, in order to improve the memory erase/write performance and reliability and the memory density of the memory array, reduce the entire memory chip area and save the costs.

Although the present invention has been described with reference to one or more exemplary embodiments, those skilled in the art can appreciate various suitable modifications and equivalent arrangements to the device structure or method without departing from the scope of the present invention. In addition, many modifications may be made to adapt a particular situation or material to the teachings of the disclosure without departing from the scope of the invention. Therefore, it is intended that the invention not be limited to the particular embodiments disclosed as the best mode contemplated for carrying out this invention, the disclosed device structures and methods of manufacture will include all embodiments falling within the scope of the invention.

The invention claimed is:

1. A three-dimensional semiconductor device includes:
   a peripheral circuit, distributed on a substrate;
   a plurality of memory cells, above the peripheral circuit, each of which includes:
      a common source region, between the memory cells and the peripheral circuit;
      a channel layer (5B1,5B1'), distributed in a direction perpendicular to the surface of the substrate;
      at least one substrate contact layer (5B2), extending horizontally from a central portion of the channel layer parallel to the surface of the substrate, each of the said at least one substrate contact layer (5B2) comprising at least one substrate contact region (5E);
      a plurality of insulating layers, located on sidewalls of the channel layer;
      a plurality of control gates, sandwiched between adjacent insulating layers;
      a gate dielectric layer, located between the channel layer and the control gates;
      a drain region, located on top of the channel layer;
      a substrate contact lead-out line, electrically connected to the substrate contact regions; and
   a plurality of bit line wiring, electrically connected to the drain regions of each memory cell and the peripheral circuit.

2. The three-dimensional semiconductor device according to claim 1, wherein the channel layer is divided into a plurality of segments by the substrate contact layers; a cross-sectional shape of the channel layer parallel to the substrate surface includes at least one selected from the group consisting of rectangle, square, diamond, circle, semi-circle, ellipse, triangle, pentagon, hexagon, octagon, and combinations thereof, as well as geometric shapes including selected from the group consisting of solid geometric shapes, hollow annular geometrical shapes, or a combination of a hollow annular peripheral layer and a central insulating layer evolved from the above geometric shapes; the channel layer is a monocrystal, polycrystalline, microcrystalline or amorphous layer and the material is selected from Group IV elements, Group IV compounds, Group III-V compounds, Group II-VI compounds semiconductors such as single crystal Si, amorphous Si, polycrystalline Si, microcrystalline Si, monocrystal Ge, SiGe, Si:C, SiGe:C, SiGe:H, GeSn, InSn, InN, InP, GaN, GaP, GaSn, GaAs, or a combination thereof, and further comprises a channel filling layer of a material of air, oxide, or nitride.

3. The three-dimensional semiconductor device of claim 1, wherein the gate dielectric layer further comprises a tunneling layer, a storage layer and a blocking layer; the tunneling layer comprises a single-layer structure or a multi-layer stack structure of SiO2 or a high-k material; the storage layer is a single-layer structure or a multi-layer stack structure of a dielectric material having charge trapping capability, including any one of SiN, SiON, HfO, ZrO, and combinations thereof; the blocking layer is a single-layer structure or a multi-layer stack structure of silicon oxide, aluminum oxide, hafnium oxide, or the like.

4. The three-dimensional semiconductor device of claim 1, wherein the material of the control gate is selected from any one of doped polysilicon, doped monocrystal silicon, metal, metal alloy, conductive metal oxide, conductive metal nitride, conductive metal silicide or a combination thereof; and further comprise a floating gate horizontally adjacent to the control gate via the insulating layer and/or the gate dielectric layer between adjacent insulating layers.

5. The three-dimensional semiconductor device according to claim 1, wherein the common source region comprises any one or a combination of doped polysilicon, doped monocrystal silicon, metal silicide and metal nitride; the common source region has a different conductivity type from the channel layer and/or the substrate contact regions.

6. A three-dimensional semiconductor device manufacturing method, comprising the steps of:
(a) forming a peripheral circuit on a substrate;
(b) forming a common source region on the peripheral circuit;
(c) forming a insulating layer stack, which comprises a plurality of first material layers and a plurality of second material layers alternately stacked;
(d) etching the insulation layer stack to form a plurality of vertical first openings, forming a gate dielectric layer on sidewalls of the vertical first openings, and forming a channel layer on sidewalls of each of the vertical first openings and on top of the insulation layer stack;
(e) recycling steps c and d until at least one substrate contact layer is formed in the channel layer and on top of the adjacent insulating layer stacks;
(f) forming a drain region on top of the channel layer;
(g) selectively etching to remove the second material layers, and then forming a plurality of control gates in recesses between every two of the remaining first material layers;
(h) etching the first material layers and the control gates to form a plurality of second openings exposing the substrate contact layers, forming a substrate contact region at a bottom of each of the second openings, forming a substrate contact lead-out line in each of the second openings;
(i) forming a plurality of bit line wirings, electrically connecting the drain region and the peripheral circuit.

7. The three-dimensional semiconductor device manufacturing method according to claim 6, wherein step (b) further comprises:
etching an interlayer dielectric (ILD) on the peripheral circuit to form grooves;
filling with doped semiconductor or conductor to form the common source region; and
planarizing the common source region until said ILD is exposed; or
depositing doped semiconductor or conductor in the peripheral circuit and etching to form the common source region;
forming an ILD covering the common source region; and
planarizing the ILD until the common source region is exposed.

8. The three-dimensional semiconductor device manufacturing method according to claim 6, wherein step (g) further comprises:
selectively etching to remove the second material layers to leave the recesses between the remaining first material layers,
forming a floating gate in each of the recesses;
forming an insulating layer and/or the gate dielectric layer on each floating gate; and
forming a control gate on the insulating layer and/or the gate dielectric layer in each of the recesses.

9. The three-dimensional semiconductor device manufacturing method according to claim 6, wherein an ion implantation is performed to form the substrate contact regions in step (h); the substrate contact regions have different conductivity type from the common source region.

10. A three-dimensional semiconductor device manufacturing method,
comprising the steps of:
(a) forming a peripheral circuit on a substrate;
(b) forming a common source region on the peripheral circuit;
(c2) forming a plurality of insulating layer stacks on the common source region, each of which comprises a plurality of first material layers and a plurality of second material layers alternately stacked; and forming at least one substrate contact layer between adjacent insulating layer stacks;
(d2) etching the plurality of insulating layer stacks and at least one substrate contact layer to form a plurality of vertical first openings;
(e2) forming a channel layer on sidewalls of each of the vertical first openings and on top of the insulating layer stacks;
(f) forming a plurality of drain regions on top of the channel layers;
(g2) selectively etching to remove the second material layers, and then forming a gate dielectric layer and a plurality of control gates in recesses between every two of the remaining first material layers;
(h) etching the first material layers and the control gates to form a plurality of second openings exposing the substrate contact layers, forming a substrate contact region at a bottom of each of the second openings, forming a substrate contact lead-out line in each of the second openings;
(i) forming a plurality of bit line wirings, electrically connecting the drain region and the peripheral circuit.

11. The three-dimensional semiconductor device manufacturing method according to claim 10, wherein step (b) further comprises:
etching an interlayer dielectric (ILD) on the peripheral circuit to form grooves;
filling with doped semiconductor or conductor to form the common source region; and
planarizing the common source region until said ILD is exposed; or
depositing doped semiconductor or conductor in the peripheral circuit and etching to form the common source region;
forming an ILD covering the common source region; and
planarizing the ILD until the common source region is exposed.

12. The three-dimensional semiconductor device manufacturing method according to claim 10, wherein step (g2) further comprises:
selectively etching to remove the second material layers to leave the recesses between the remaining first material layers,
forming a floating gate in each of the recesses;
forming an insulating layer and/or the gate dielectric layer on each floating gate; and
forming a control gate on the insulating layer and/or the gate dielectric layer in each of the recesses.

13. The three-dimensional semiconductor device manufacturing method according to claim 10, wherein an ion implantation is performed to form the substrate contact regions in step (h); the substrate contact regions have a different conductivity type from the common source region.

* * * * *